(12) United States Patent
Yoo et al.

(10) Patent No.: US 9,655,250 B2
(45) Date of Patent: May 16, 2017

(54) METHOD OF FORMING INSULATING LAYER AND TOUCHSCREEN MANUFACTURED USING THE SAME

(71) Applicant: LG CHEM, LTD., Seoul (KR)

(72) Inventors: Jae-Hyun Yoo, Daejeon (KR); Mi-Kyoung Kim, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 13 days.

(21) Appl. No.: 14/381,498

(22) PCT Filed: Jun. 3, 2014

(86) PCT No.: PCT/KR2014/004932
§ 371 (c)(1),
(2) Date: Aug. 27, 2014

(87) PCT Pub. No.: WO2014/204117
PCT Pub. Date: Dec. 24, 2014

(65) Prior Publication Data
US 2016/0252994 A1      Sep. 1, 2016

(30) Foreign Application Priority Data

Jun. 18, 2013   (KR) .................. 10-2013-0069894
Jun. 2, 2014    (KR) .................. 10-2014-0067205

(51) Int. Cl.
*H05K 3/00*   (2006.01)
*H05K 3/38*   (2006.01)

(52) U.S. Cl.
CPC .. *H05K 3/0011* (2013.01); *G06F 2203/04103* (2013.01); *G06F 2203/04111* (2013.01);
(Continued)

(58) Field of Classification Search
CPC ... H05K 2201/10128; H05K 2201/026; H05K 3/381; H05K 3/0014; H05K 3/011; G06F 2203/04103; G06F 2203/04111
See application file for complete search history.

(56) References Cited

U.S. PATENT DOCUMENTS

2011/0120326 A1    5/2011   Nakashima et al.
2012/0031746 A1*   2/2012   Hwang ................. G06F 3/041
                                                        200/5 A
(Continued)

FOREIGN PATENT DOCUMENTS

EP     2568367 A2      3/2013
KR     1020100090668 A 8/2010
(Continued)

*Primary Examiner* — Liliana Cerullo
(74) *Attorney, Agent, or Firm* — Dentons US LLP

(57) ABSTRACT

A method of forming an insulating layer and a touchscreen including the insulating layer formed using the same are provided. The method of forming an insulating layer insulating a conductive pattern of a touchscreen from a bridge electrode thereof includes heating a substrate provided with the conductive pattern formed on the substrate, sequentially forming a first pattern and a second pattern on the heated substrate using an insulating composition, and curing the first pattern and the second pattern. The first pattern includes a groove portion to prevent adjacent patterns from overlapping each other and the second pattern is formed in the groove portion of the first pattern.

21 Claims, 9 Drawing Sheets

(52) U.S. Cl.
CPC ........... *H05K 3/0014* (2013.01); *H05K 3/381* (2013.01); *H05K 2201/026* (2013.01); *H05K 2201/10128* (2013.01)

(56) References Cited

U.S. PATENT DOCUMENTS

2013/0057497 A1* 3/2013 Cho .................. G06F 3/044
                                                     345/173
2013/0207930 A1* 8/2013 Lin .................... G06F 3/044
                                                     345/174

FOREIGN PATENT DOCUMENTS

| KR | 1020120092004 A | 8/2012 |
| KR | 1020130051316 A | 5/2013 |

\* cited by examiner

Ra : 132.70 nm  Rq : 160.61 nm  Rt : 2.27 um

Ra : 436.47 nm  Rq : 0.54 um  Rt : 6.14 um

Ra : 365.80 nm  Rq : 482.00 nm  Rt : 12.54 um

X-DISTANCE (mm)

Ra : 297.58 nm  Rq : 387.26 nm  Rt : 3.24 um

X-DISTANCE (mm)

METHOD OF FORMING INSULATING LAYER AND TOUCHSCREEN MANUFACTURED USING THE SAME

This application is a 35 USC §371 National Stage entry of International Application No. PCT/KR2014/004932 filed on Jun. 3, 2014, and claims priority to Korean Application Nos. 10-2013-0069894 filed on Jun. 18, 2013 and 10-2014-0067205 filed on Jun. 2, 2014, which are hereby incorporated by reference in their entireties as if fully set forth herein.

TECHNICAL FIELD

The present disclosure relates to a method of forming an insulating layer insulating a conductive pattern from a bridge electrode of a touchscreen and a touchscreen manufactured using the same.

BACKGROUND ART

Recently, display devices such as liquid crystal displays, electroluminescent displays, and plasma display panels, and the like, have been widely used due to inherent advantages thereof, such as rapid response speeds, low power consumption, and excellent color reproduction characteristics. Such display devices have been used in various electronic products such as televisions, computer monitors, notebook computers, mobile phones, refrigerator display units, personal digital assistants, automated teller machines, and the like. In general, such display devices include user interfaces using various input devices, for example, keyboards, computer mice, digitizers, and the like.

However, using a separate input device such as a keyboard, a mouse, or the like, may cause user inconvenience, in that users must learn the usage thereof, room therefor is required, and the like. Therefore, demand for an input device having a simplified structure and capable of reducing errors in an operation thereof while being conveniently used has increased. In accordance with such demand, a touchscreen with which a user may interact with a device through direct touch interaction, for example, direct contact between a screen and a user's fingers, a stylus, or the like, has been proposed.

In the case of a touchscreen, due to convenience in which a user may not only input information thereto without using a separate input device, but also rapidly and easily manipulate the touchscreen through icons displayed on the screen, touchscreen devices have been applied to various display apparatuses.

Meanwhile, in accordance with the recent trend for thinness in display devices, touchscreens are required to be thinned, and according to such a tendency, single-surface integrated touchscreens are under development.

FIG. 1 illustrates an example of a single-surface integrated touchscreen according to the related art. As illustrated in FIG. 1, the single-surface integrated touchscreen includes a substrate (not shown), a conductive pattern 20 formed on the substrate, an insulating layer 30 and a bridge electrode 40. Such a single-surface integrated touchscreen is generally manufactured through processes of forming a conductive pattern on a substrate, forming an insulating layer, and forming a bridge electrode.

On the other hand, the conductive patterns 20 are connected to one another in an x-axis direction, but are separated from one another in a y-axis direction. In addition, the bridge electrode 40 is provided to connect the separated y-axis conductive patterns to one another, and is generally formed using a conductive polymer, silver nanowire or the like. In this case, in order to separate the conductive patterns from the bridge electrode so as not to allow for the generation of conduction therebetween, the insulating layer 30 is formed between the conductive pattern and the bridge electrode.

Such a single-surface integrated touchscreen is generally manufactured through processes of forming a conductive pattern on a substrate, forming an insulating layer, and forming a bridge electrode. Here, the insulating layer 30 may be formed through a scheme in which an insulation composition is printed on a conductive pattern so as to have a predetermined pattern shape through a printing process using inkjet, screen, or the like.

However, in the case of using an insulation layer forming method according to the related art, a problem of a coffee ring phenomenon may be present, in which a height of an edge portion of an insulating layer is higher than that of a central portion thereof after a drying process due to a difference in an evaporation rate between the interior of a pattern and the exterior thereof at the time of curing the insulating layer. In the case of the occurrence of the coffee ring phenomenon, a bridge electrode may be cut or a connection state thereof may be deteriorated due to the occurrence of a relatively high level of step portion therein. In addition, in a case in which as the conductive pattern, a metal mesh is used, a phenomenon in which an ink composition flows along metal mesh pattern portions at the time of forming an insulation layer pattern may occur, such that it may be difficult to precisely form a pattern in a desired position. Furthermore, in this case, a problem in which a touch sensing function may be degraded due to the bridge electrode that is provided to connect y-axis conductive patterns to each other but that does not contact the conductive pattern, and the like, may occur.

DISCLOSURE

Technical Problem

Some embodiments of the present disclosure may provide a method of forming an insulating layer by performing a patterning process through two operations, by which a coffee ring phenomenon may be prevented, an insulating layer may have a uniform thickness, and an insulation layer composition may be prevented from flowing along a conductive pattern portion formed on a substrate so as to allow for stabilized formation of a pattern in a necessary position, and an insulating layer formed using the same.

Technical Solution

According to a first aspect of the present disclosure, a method of forming an insulating layer insulating a conductive pattern of a touchscreen from a bridge electrode of the touchscreen may include heating a substrate provided with the conductive pattern formed on the substrate, sequentially forming a first pattern and a second pattern on the heated substrate using an insulating composition, and curing the first pattern and the second pattern. The first pattern may include a groove portion to prevent adjacent patterns from overlapping each other and the second pattern may be formed in the groove portion of the first pattern.

According to a second aspect of the present disclosure, a touchscreen including a substrate, a conductive pattern formed on the substrate, a bridge electrode formed on the conductive pattern, and an insulating layer interposed between the conductive pattern and the bridge electrode to insulate the conductive pattern from the bridge electrode, may be characterized in that the insulating layer is formed using the method of forming an insulating layer as described above and has a convex shape in a vertical cross section thereof.

Advantageous Effects

According to a first aspect of the present disclosure, a method of forming an insulating layer insulating a conductive pattern of a touchscreen from a bridge electrode thereof may include heating a substrate provided with the conductive pattern formed on the substrate, sequentially forming a first pattern and a second pattern on the heated substrate using an insulating composition, and curing the first pattern and the second pattern. The first pattern may include a groove portion to prevent adjacent patterns from overlapping each other and the second pattern may be formed in the groove portion of the first pattern.

According to a second aspect of the present disclosure, a touchscreen including a substrate, a conductive pattern formed on the substrate, a bridge electrode formed on the conductive pattern, and an insulating layer interposed between the conductive pattern and the bridge electrode to insulate the conductive pattern from the bridge electrode, may be characterized in that the insulating layer is formed using the method of forming an insulating layer according to the exemplary embodiment of the present disclosure and has a convex shape in a vertical cross section thereof.

BEST MODE

Figure 1:
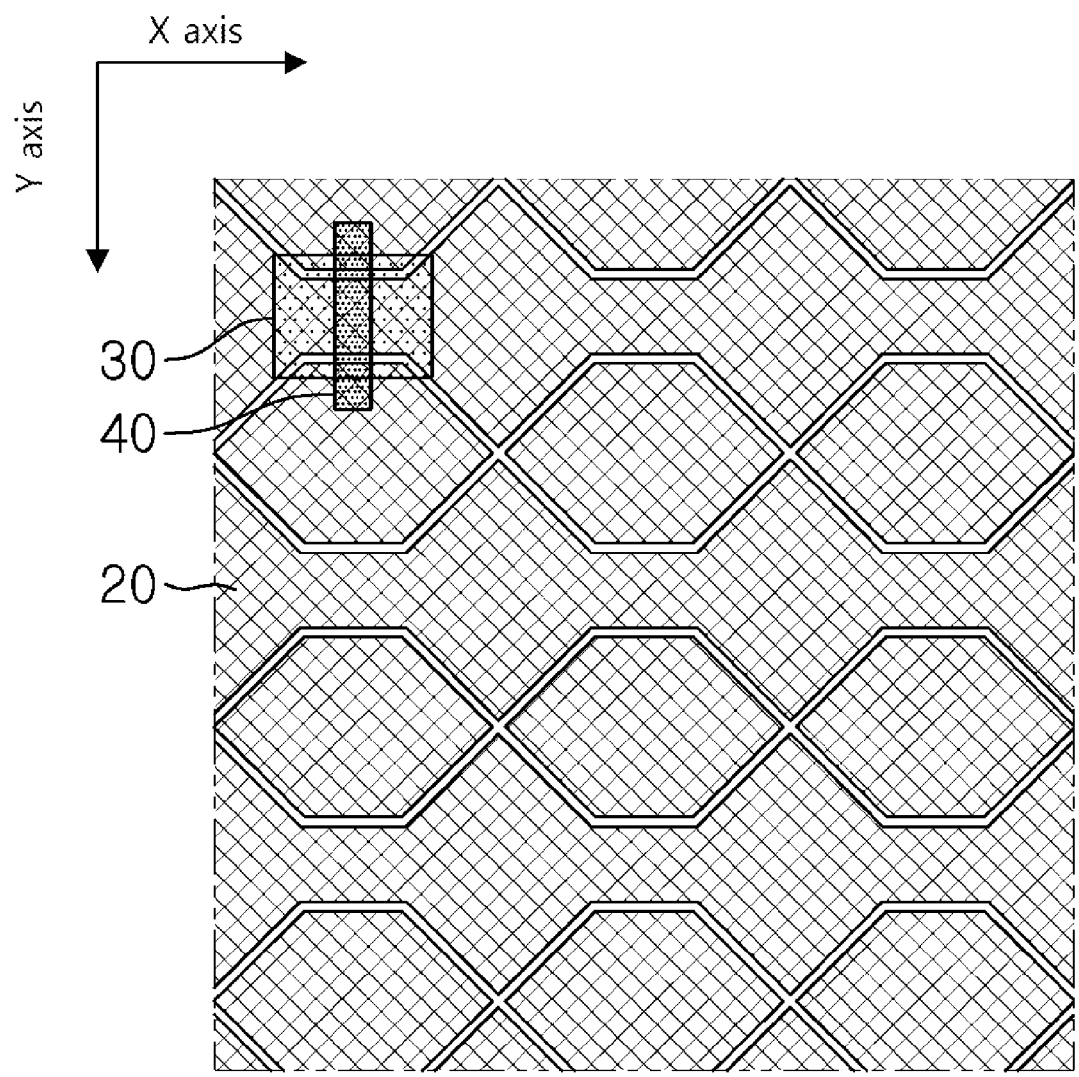
FIG. 1 is an image illustrating an example of a single-surface integrated touchscreen.

Exemplary embodiments of the present disclosure will now be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

The present disclosure is provided as results of research into the development of a method of forming an insulating layer, by which a coffee ring phenomenon may be significantly reduced and an insulating layer composition may be prevented from flowing along a conductive pattern portion, so as to form an insulating layer having a uniform thickness and shape on a substrate on which a conductive pattern is formed.

A method of forming an insulating layer according to an exemplary embodiment of the present disclosure may include heating a substrate on which a conductive pattern is formed, sequentially forming a first pattern and a second pattern on the heated substrate using an insulating composition, and curing the first pattern and the second pattern. Here, the first pattern may include a groove portion to prevent adjacent patterns from overlapping each other, and the second pattern may be formed in the groove portion of the first pattern.

In the present disclosure, the groove portion may refer to a vacant region in the first pattern in which an insulating composition is not coated. In addition, according to an exemplary embodiment of the present disclosure, the first pattern may be configured of the groove portion and a plurality of dot shapes or linear shapes not overlapping each other.

Hereinafter, a method of forming an insulating layer according to an exemplary embodiment of the present disclosure will be described in detail.

First, a process of heating a substrate on which a conductive pattern has been formed may be performed. Since a patterning process for the formation of an insulating layer is performed after heating the substrate having the conductive pattern formed thereon, a phenomenon in which an insulating composition flows along the conductive pattern on the substrate may be prevented, and the pattern may thus be stably formed.

In this case, for example, the substrate may be heated in a temperature range of about 40° C. to 80° C., 50° C. to 70° C., or 55° C. to 65° C. In accordance with the research results with respect to the present disclosure, when a heating temperature of the substrate on which the conductive pattern is formed satisfies such numerical ranges, a coffee ring phenomenon may be significantly reduced, and an insulating layer thickness may be uniformly formed.

On the other hand, the conductive pattern formed on the substrate may be formed using commonly and generally used materials for the formation of a conductive pattern, for example, a metal mesh, a metal-containing paste, or the like, may be used, but the present disclosure is not limited thereto.

Subsequently, a first pattern and a second pattern may be sequentially formed using an insulating composition on the heated substrate.

In this case, a method of forming the first pattern and the second pattern may be performed using, for example, a method of ejecting droplets of an insulating composition through an inkjet printing method. The first and second patterns formed using the ejected droplets may have a dot or linear shape. In detail, in the case of the method of forming an insulating layer according to an exemplary embodiment of the present disclosure, the first and second patterns may have a dot shape, in that the precise formation of a pattern in a desired position may be easily undertaken.

On the other hand, according to an exemplary embodiment of the present disclosure, the first pattern may include a groove portion to prevent adjacent patterns from overlapping each other, and the second pattern may be formed in the groove portion of the first pattern. For example, the first pattern may be configured of a plurality of dot shapes or linear shapes not overlapping each other.

On the other hand, a pitch, a size, or a line width, and the like of the first pattern are not particularly limited as long as the first pattern may have a vacant region, for example, a groove portion between a dot and a dot or between a line and a line thereof while not overlapping each other. However, in consideration of a thickness of an insulating layer, a pitch of the first pattern may be in a range of, for example, about 200 µm to 400 µm, about 250 µm to 380 µm, or about 280 µm to 350 µm. When the pitch of the first pattern satisfies such ranges, a region in which the second pattern is to be appropriately formed may be secured, and a thickness and a shape of the entirety of the insulating layer may be appropriate thereto.

Then, the second pattern may be formed in the groove portion of the first pattern. In this case, the second pattern may be configured of a plurality of dots or linear shapes, and a shape, a size, a pitch and the like, thereof are not particularly limited. However, in consideration of a thickness and a shape of the insulating layer, a pitch of the second pattern may be around 0.5 to 1 times that of the first pattern. When the pitch of the second pattern satisfies such numerical ranges, a thickness of the insulating layer may be uniformly formed, and a shape of the insulating layer may also be precisely formed. Here, as the pitch of the second pattern is further decreased as compared with that of the first pattern, an amount of the insulating composition in the groove portion may be further increased.

Hereinafter, shapes, pitches, sizes, and the like of the first pattern and the second pattern will be described in detail with reference to FIGS. 2A, 2B, 3A and 3B.

Figure 2A:
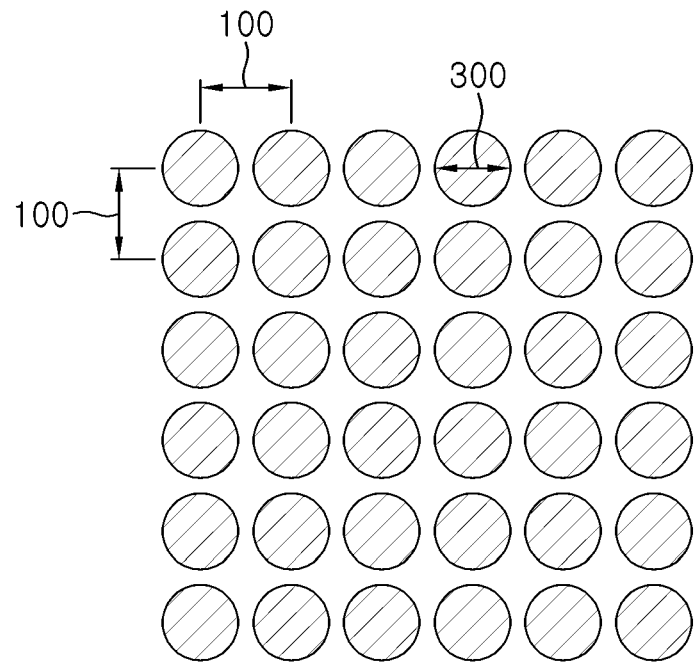
FIG. 2A illustrates an example in which a first pattern has a dot shape.
Figure 2B:
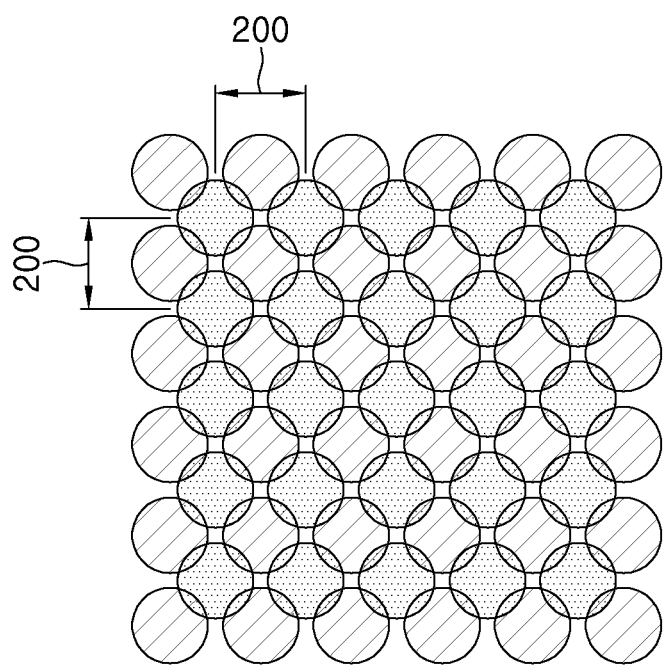
FIG. 2B illustrates an example in which a second pattern has a dot shape.

FIGS. 2A and 2B illustrate examples in a case in which the first pattern and the second pattern have a dot shape. In a case in which the first and second patterns have a dot shape, pitches thereof may refer to distances 100 and 200 between a center of one dot and a center of a dot adjacent thereto in a horizontal direction or a vertical direction, respectively, as illustrated in FIGS. 2A and 2B.

On the other hand, when the first pattern and the second pattern are formed of dots, the size of dots of the first pattern may be, for example, 0.8 to 1 times that of a pitch of the first pattern, and the size of dots of the second pattern may be, for example, 0.5 to 1 times that of the dots of the first pattern. When the sizes of the dots of the first and second patterns satisfy such numerical ranges, in the case of forming a pattern of dots, the sizes of the dots of the first and second patterns may be appropriately adjusted so as to form an insulating layer having a uniform thickness. Here, the size of dots may be defined as a diameter 300 of a respective dot as illustrated in FIG. 2A.

Figure 3A:
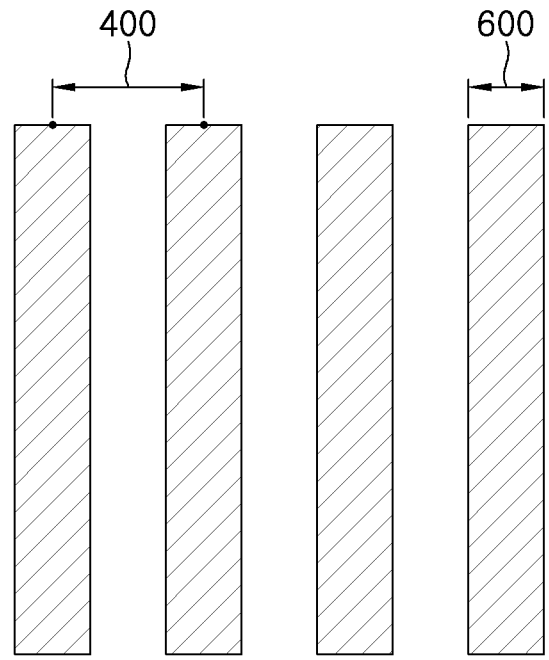
FIG. 3A illustrates an example in which the first pattern has a linear shape.
Figure 3B:
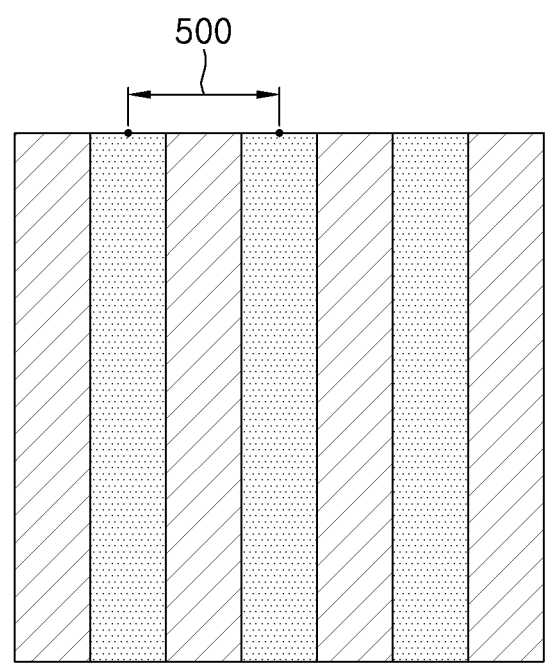
FIG. 3B illustrates an example in which the second pattern has a linear shape.

FIGS. 3A and 3B illustrate examples in a case in which the first pattern and the second pattern have a linear shape. When the first pattern and the second pattern have a linear shape, the pitch thereof may refer to distances 400 and 500 between a center of a line width of one line and a center of a line width of a line adjacent thereto, respectively, as illustrated in FIGS. 3A and 3B.

In addition, in the case in which the first and second patterns have a linear shape, when a line width of the first pattern may be, for example, 0.8 to 1 times a pitch of the first pattern, and a line width of the second pattern may be, for example, 0.5 to 1 times the line width of the first pattern. When the line widths of the first and second patterns satisfy such numerical ranges, an insulating layer having a uniform thickness may be formed by appropriately adjusting the line widths of the first and second patterns at the time of forming a pattern having a linear shape. Here, the line width refers to a linewidth 600 of a respective line as illustrated in FIG. 3A.

According to the research results in the present disclosure, in a case in which patterning of an insulation layer composition is performed through two operations on a substrate as described above, a difference in an evaporation rate between an edge portion and a central portion of the formed insulating layer may be reduced such that a coffee ring phenomenon may be prevented. In addition, when the patterning process is performed on a heated substrate, an insulating composition for the formation of the insulating layer may be prevented from flowing along a conductive pattern portion on the substrate such that a pattern may be stably formed.

The first pattern and the second pattern are formed on the substrate through such processes and the first and second patterns may then be cured.

The process of curing the first and second patterns may be performed without particular limitations as long as it is a commonly known method. For example, an oven, a hot plate, or the like, may be used. In addition, for example, the curing may be performed at a temperature of 100° C. to 180° C. for 5 to 90 minutes.

On the other hand, the insulating composition for the formation of the first pattern and the second pattern according to an exemplary embodiment of the present disclosure may be used without particular limitations as long as it is a commonly known material. For example, a novolac-type epoxy resin, a high boiling point solvent having a boiling point of 170° C. or higher, a low boiling point solvent having a boiling point ranging from 100° C. or higher to less than 170° C., and a curing agent.

In further detail, the novolac-type epoxy resin is to provide insulation properties. For example, a phenol novolac-type epoxy resin, a cresol novolac-type epoxy resin or a bisphenol A (BPA)-novolac type epoxy resin, or the like may be used, but is not limited thereto. In more detail, according to an exemplary embodiment of the present disclosure, the novolac-type epoxy resin may be a phenol novolac-type epoxy resin due to relatively further excellent film characteristics obtained through an insulating layer formed using an insulating composition containing such a phenol novolac-type epoxy resin.

In this case, as commercially available products that may be used as the novolac-type epoxy resin, for example, Epikote 631, Epikote 678, Epikote 690 (by Hexion), EPPN-501H or EPPN-502H (by Nagase), or the like may be used.

In addition, the solvent may be used to provide process characteristics when the patterning is performed in an inkjet process, and may contain a high boiling point solvent and a low boiling point solvent.

In this case, the high boiling point solvent may refer to a solvent having a high boiling point of 170° C. or higher, and for example, may be one or more selected from a group consisting of ethylene glycol monobutyl etheracetate, diethylene glycolmonobutyl ether acetate, diethyleneglycol monoethyl ether acetate, diethylene glycol monomethyl ether acetate, dipropylene glycol monomethyl ether acetate, dipropylene glycol monoethylether acetate, dipropylene glycolpropyl ether acetate, dipropyleneglycol monobutyl ether acetate, diethyleneglycol monomethyl ether, diethylene glycolmonoethyl ether, diethylene glycolmonopropyl ether, diethylene glycol monobutylether, diethylene glycol monohexyl ether, triethylene glycol monomethyl ether, triethylene glycol monoethyl ether, triethylene glycol monobutyl ether, triethylene glycol monopropyl ether, dipropylene glycol monobutyl ether, tripropylene glycol monometyl ether, and tripropylene glycol monobutyl ether, but is not limited thereto.

In addition, the low boiling point solvent may refer to a solvent having a boiling point ranging from 100° C. or higher to less than 170° C., and for example, may be one or more selected from a group consisting of diethylene glycol dimethylether, diethylene glycol diethylether, methyl ethyl ketone, cyclohexanone, 4-hydroxy-4-methyl-2-pentanon, ethyllactate, methyl lactate, propyl lactate, butyl lactate, propyleneglycol methyl ether acetate, ethyleneglycol monomethyl ether acetate, ethyleneglycol ethyl ether acetate, propylene glycol monobutyl ether acetate, ethylisobutyl ether, ethyl ethoxy propionate, methoxy propanol, butoxy propanol, 2-butoxy ethanol, butyl acetate, 1-butoxy-2-propanol, dimethyl ketone, methyl butyl ketone, and methyl hexyl ketone, but is not limited thereto.

In detail, in the solvents, a weight ratio of the high boiling point solvent to the low boiling point solvent may be within a range of 85 to 99:1 to 15, or 87 to 95:5 to 13, When the weight ratio of the high boiling point solvent and the low boiling point solvent satisfies the numerical range, jetting may be stably performed.

In addition, in the insulating composition, the entire content of the high boiling point solvent and the low boiling point solvent may be 80 parts by weight to 570 parts by weight, 100 parts by weight to 450 parts by weight, or 150 parts by weight to 400 parts by weight, based on 100 parts by weight of the phenol novolac-type epoxy resin. When the content of the solvent satisfies these numerical ranges, since the viscosity of ink may be maintained at an appropriate level, jetting characteristics may be excellent, and a drying process after the patterning process may be easily performed.

Further, the curing agent is to cure the insulating layer. As an example of the curing agent for the epoxy resin, an imidazole-based curing agent, an amine-based curing agent such as aliphatic, aromatic or denatured aliphatic polyamine, an aromatic or alicyclic acid anhydride-based curing agent, a mercaptane-based curing agent, or an isocyanate-based curing agent, or the like, may be used.

In detail, as the curing agent contained in the insulating composition used in the method of forming an insulating layer according to an exemplary embodiment of the present disclosure, the imidazole-based curing agent may be used. Since the imidazole-based curing agent has high stability in terms of the storage of ink and a rapid curing reaction, it may have excellent film insulation characteristics.

In further detail, for example, the imidazole-based curing agent may be one or more selected from a group consisting of 2-methylimidazole, 2-undecylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2,4-diamino-6-[2'-methylimidazolyl-(1')]-ethyl-s-triazine, 2-phenyl-4,5-dihydroxymethylimidazole, and 2-phenyl-4-methyl-5-hydroxymethylimidazole, but is not limited thereto.

In more detail, according to an exemplary embodiment of the present disclosure, the curing agent may be 1-cyanoethyl-2-phenylimidazole (2PZCN) or 2-ethyl-4-methylimidazole (2E4MZ), in terms of high stability in the storage of ink and a rapid curing reaction so as to allow for further excellent insulation characteristics of the film.

In further detail, in the method of forming an insulating layer according to an exemplary embodiment of the present disclosure, the insulating composition may contain 100 parts by weight of a phenol novolac-type epoxy resin, 80 to 570 parts by weight of a solvent, and 10 parts by weight of a curing agent. Here, in the solvent, a weight ratio of the high boiling point solvent to the low boiling point solvent may be within a range of 85 to 99:1 to 15.

As necessary, the insulating composition used in the method of forming an insulating layer according to an exemplary embodiment of the present disclosure may further contain a surfactant to improve spreadability of ink at the time of performing an inkjet process, and may further contain an adhesion promoter, or the like, so as to improve adhesion. In addition, the additive such as the surfactant, the adhesion promoter, or the like may be contained in an amount of 5 parts by weight or less, based on 100 parts by weight of the insulating composition.

The insulating layer formed using the method of forming an insulating layer according to an exemplary embodiment of the present disclosure may have a uniform thickness so as to prevent a coffee ring phenomenon. Thus, a bridge electrode may be stably formed on the insulating layer while exhibiting excellent effects in which electrical conductivity may be improved.

In addition, in the case of the insulating layer formed using the method of forming an insulating layer according to an exemplary embodiment of the present disclosure, stabilized pattern formation may be performed in a desired precise position, thereby improving the productivity thereof.

Further, in the case of the insulating layer formed using the method of forming an insulating layer according to an exemplary embodiment of the present disclosure, since a vertical cross section thereof may have a convex shape unlike that in the related art, the insulating layer may be usefully used as an insulating layer for insulating a conductive pattern from a bridge electrode on a touchscreen.

For example, in the case of the insulating layer formed using the method of forming an insulating layer according to an exemplary embodiment of the present disclosure, the vertical cross section thereof may have a convex shape, and in the vertical cross section of the insulating layer, a difference in a thickness between a central portion of the vertical cross section of the insulating layer and an edge portion thereof may be within a range of, for example, 50 nm to 150 nm, 50 nm to 130 nm, or 50 nm to 100 nm. When the difference in the thickness between the central portion of the vertical cross section of the insulating layer and an edge portion thereof satisfies the numerical range, it indicates that the thickness of the insulating layer may be uniform, and in the case of the application thereof to a touchscreen, film strength may be excellent, and a coffee ring phenomenon may be prevented to thus exhibit excellent insulation effects.

In this case, the thickness of the insulating layer may be within a range of 100 nm to 2 μm, 200 nm to 1500 nm, or 400 nm to 1200 nm, but is not limited thereto.

In addition, according to an exemplary embodiment of the present disclosure, a touchscreen may be provided. The touchscreen according to an exemplary embodiment of the present disclosure may include a substrate, a conductive pattern formed on the substrate, a bridge electrode formed on the conductive pattern, and an insulating layer interposed between the conductive pattern and the bridge electrode to insulate the conductive pattern from the bridge electrode. Here, the insulating layer may be formed using the method of forming an insulating layer according to an exemplary embodiment of the present disclosure; and a vertical cross section of the insulating layer may have a convex shape.

Here, in the case of the touchscreen according to the exemplary embodiment of the present disclosure, the insulating layer insulating the conductive pattern from the bridge electrode may have a difference in a thickness between a central portion of a vertical cross section thereof and an edge portion thereof within a range of 50 nm to 150 nm, 50 nm to 130 nm, or 50 nm to 100 nm. In further detail, according to an exemplary embodiment of the present disclosure, when the difference in the thickness between the central portion of the vertical cross section of the insulating layer and the edge portion thereof may range from 50 nm to 100 nm. For example, when the difference in the thickness between the central portion of the vertical cross section of the insulating layer and the edge portion thereof satisfies the numerical range, it may indicate that the thickness of the insulating layer is uniform so as to sufficiently serve as the insulating layer. Since the role of the insulating layer is to separate the x-axis conductive patterns from the bridge electrode, in order to exhibit the insulation effects of the insulating layer, film strength of the insulating layer needs to be relatively excellent. In a case in which the insulating layer thickness is uniform, film strength thereof may be further increased. In addition, when the thickness of the insulating layer is not uniform, a coffee ring phenomenon may easily occur and may thus not exhibit insulation effects. For example, when a bridge electrode is formed on the insulating layer in order to connect conductive patterns to each other in a y-axis direction, in a case in which such a coffee ring phenomenon occurs, a boundary portion between the conductive patterns and the bridge electrode may be cut.

On the other hand, the edge portion of the vertical cross section of the insulating layer may refer to an outer edge having an area of around 20% on a respective pattern of the insulating layer, and the central portion thereof may refer to a portion except for the edge portion of the respective pattern of the insulating layer.

In addition, the thickness of the insulating layer may be greater than that of the conductive patterns in an X-axis direction, for example, in a range of 100 nm to 2 μm, 200 nm to 1500 nm, or 400 nm to 1200 nm, but is not limited thereto. In further detail, according to an exemplary embodiment of the present disclosure, the thickness of the insulating layer may be within a range of 400 nm to 1200 nm. When the thickness of the insulating layer satisfies the numerical range, the conduction between x-y axis conductive patterns may be prevented, and abridge electrode connecting y-axis conductive patterns to each other may be formed.

MODE FOR INVENTION

Embodiment 1

(1) Preparation of Insulating Composition 26.2 weight % of Epikote 631 (a product by Hexion), a phenol novolac-type epoxy resin, 53.7 weight % of diethylene glycol monobutyl ether acetate, 14.4 weight % of diethylene glycol methyl butyl ether, and 3.9 weight % of methyl cellosolve acetate were mixed with one another. Then, 0.3 weight % of KBM 503, an adhesive promoter, and 0.2 weight % of BYK 330, a surfactant, were added thereto. Subsequently, 1.3 weight % of 1-cyanoethyl-2-penylimidazole was added thereto and stirred for 2 hours, thereby preparing an insulating composition.

(2) Formation of Insulating Layer Pattern

A first pattern was patterned to have a dot shape on a copper mesh substrate using the insulating composition in a state in which the substrate was heated to 60° C. Here, in the formation of the first pattern, a diameter of dots of the first pattern was 250 μm, and a pitch of the first pattern was 300 μm, 1.2 times the diameter of the dots of the first pattern. Subsequently, before the insulating composition patterned as the first pattern was cured; a second pattern was patterned to have a dot shape in a state in which the substrate was heated to 60° C. A diameter of dots and a pitch of the second pattern were the same as those of the first pattern. Then, a curing process was performed thereon using an oven, at 150° C. for 15 minutes.

COMPARATIVE EXAMPLE 1

After preparing an insulating composition using the same method as that of Embodiment 1, a patterning process was performed once using the insulating composition. Then, a curing process was performed thereon using an oven at 150° C. for 15 minutes.

COMPARATIVE EXAMPLE 2

After preparing an insulating composition using the same method as that of Embodiment 1, a patterning process was performed once using the insulating composition in a state in which a substrate is heated to 85° C. Then, a curing process was performed thereon using an oven at 150° C. for 15 minutes.

COMPARATIVE EXAMPLE 3

A first pattern was patterned to have a dot shape on a copper mesh substrate using the insulating composition in a state in which the substrate was heated to 60° C. Here, in the formation of the first pattern, a diameter of dots of the first pattern was 170 μm, and a pitch of the first pattern was 255 μm, 1.5 times the diameter of the dots of the first pattern. Subsequently, before the insulating composition patterned as the first pattern was cured; a second pattern was patterned to have a dot shape in a state in which the substrate was heated to 60° C. A diameter of dots and a pitch of the second pattern were the same as those of the first pattern. Then, a curing process was performed thereon using an oven, at 150° C. for 15 minutes.

EXPERIMENTAL EXAMPLE

Measurement of Cross Sectional Shape of Insulating layer

Horizontal cross sectional shapes and Vertical cross sectional shapes of the insulating layers formed in Embodiment 1 and Comparative Examples 1 to 3 were measured using a three dimensional shape measuring apparatus. The measurement results are provided as illustrated in FIGS. 4A to 7B.

FIGS. 4A, 5A, 6A and 7A illustrate horizontal cross sectional shapes of the insulating layer, and FIGS. 4B, 5B, 6B and 7B illustrate vertical cross sectional shapes of the insulating layer. Right reference bars in FIGS. 4A, 5A, 6A and 7A refer to heights of the insulating layers, portions colored with red indicate a relatively high side and portions of blue indicates relatively low sides.

Figure 4A:
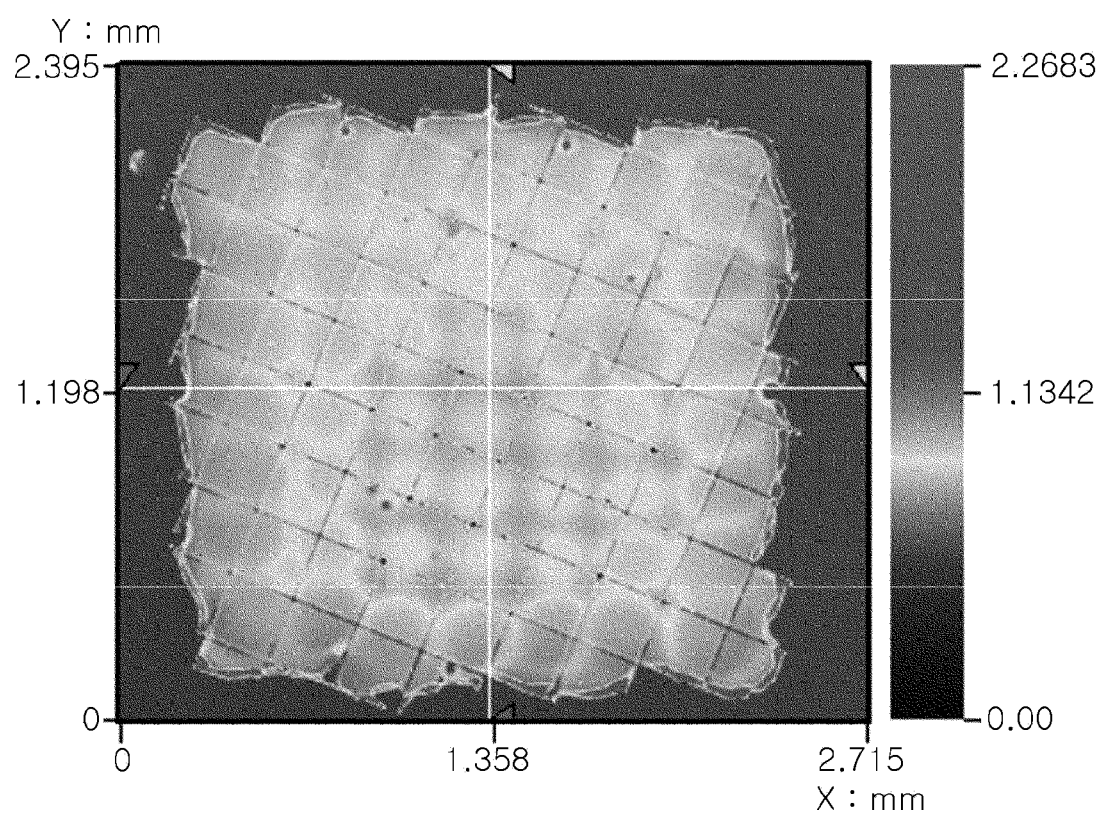
FIG. 4A is an image illustrating data obtained by measuring a horizontal cross section of an insulating layer formed using a method of forming an insulating layer according to Embodiment 1 of the present disclosure.
Figure 4B:
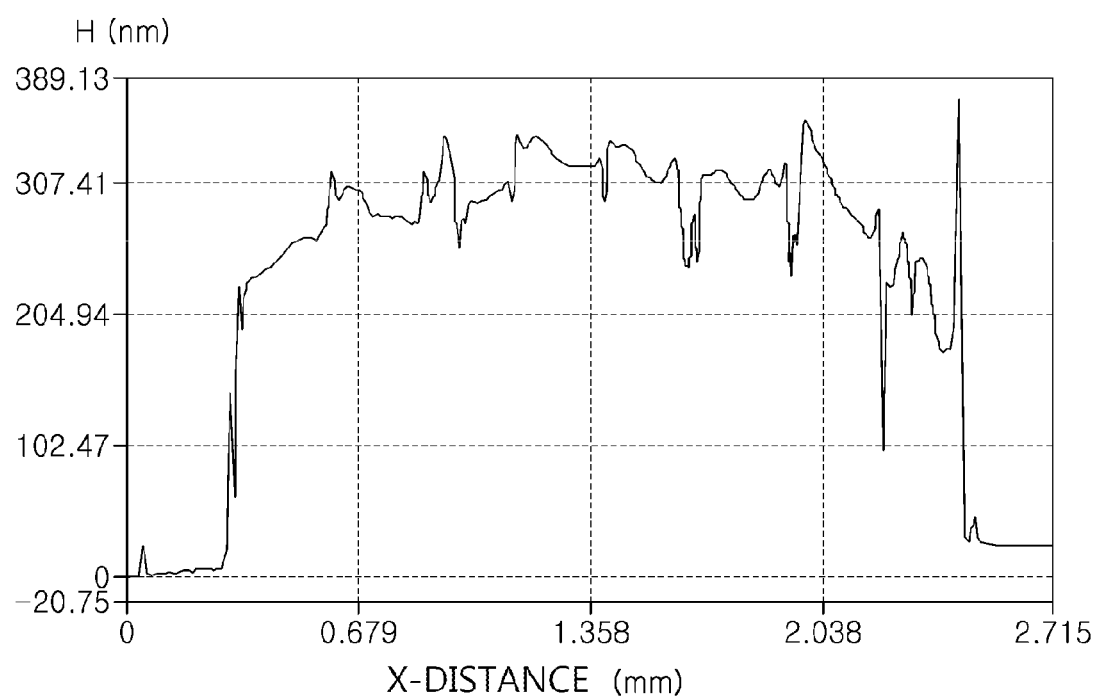
FIG. 4B is an image illustrating data obtained by measuring a vertical cross section of an insulating layer formed using the method of forming an insulating layer according to Embodiment 1 of the present disclosure.

With reference to FIG. 4A illustrating the horizontal cross sectional shape of the insulating layer according to Embodiment 1, an overall uniform level of green color is shown, and with reference to FIG. 4B illustrating the vertical cross sectional shape of the insulating layer according to Embodiment 1, it can be appreciated that a convex shape is exhibited.

Figure 5A:
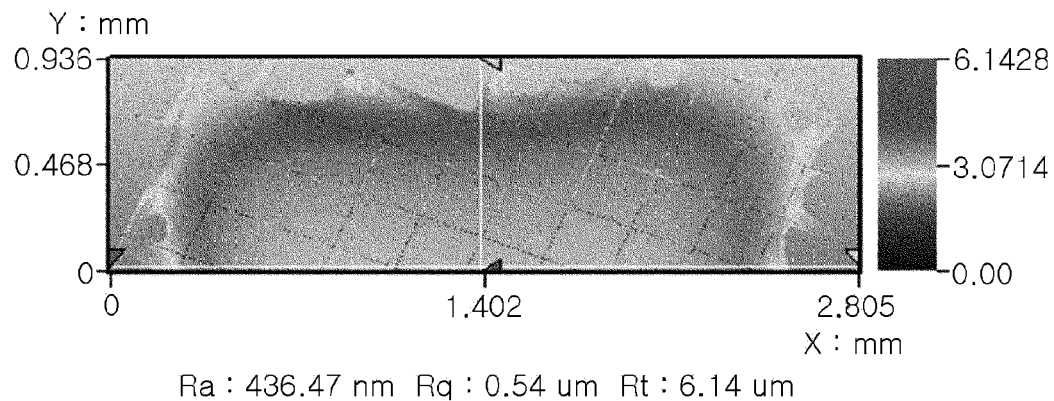
FIG. 5A is an image illustrating data obtained by measuring a horizontal cross section of an insulating layer formed using a method of forming an insulating layer according to Comparative Example 1.
Figure 5B:
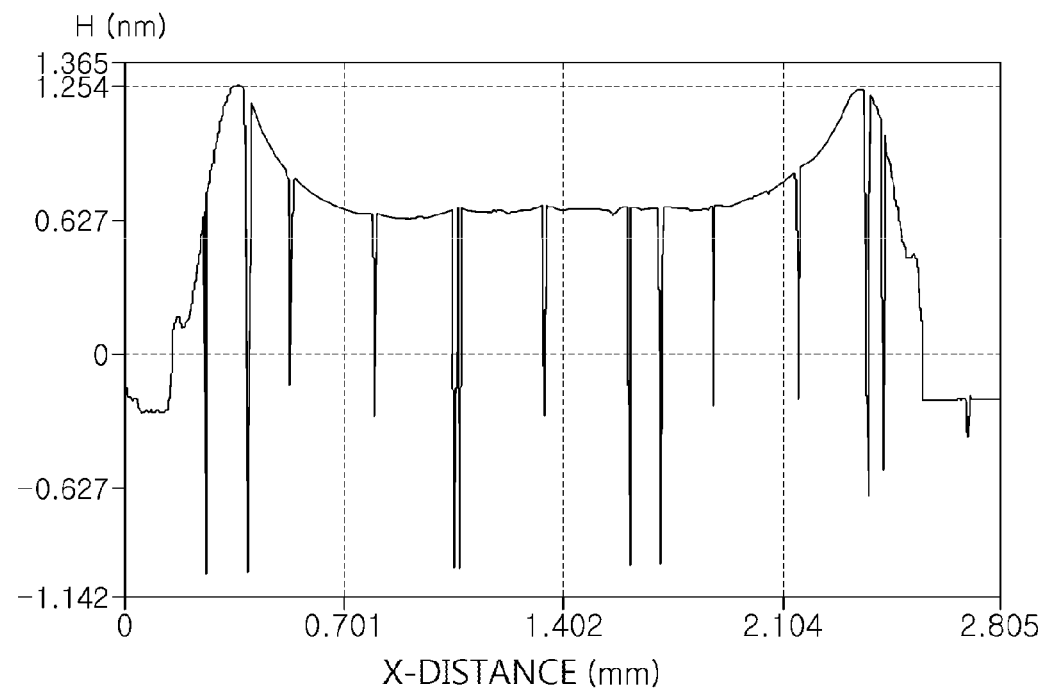
FIG. 5B is an image illustrating data obtained by measuring a vertical cross section of an insulating layer formed using the method of forming an insulating layer according to Comparative Example 1.
Figure 6A:
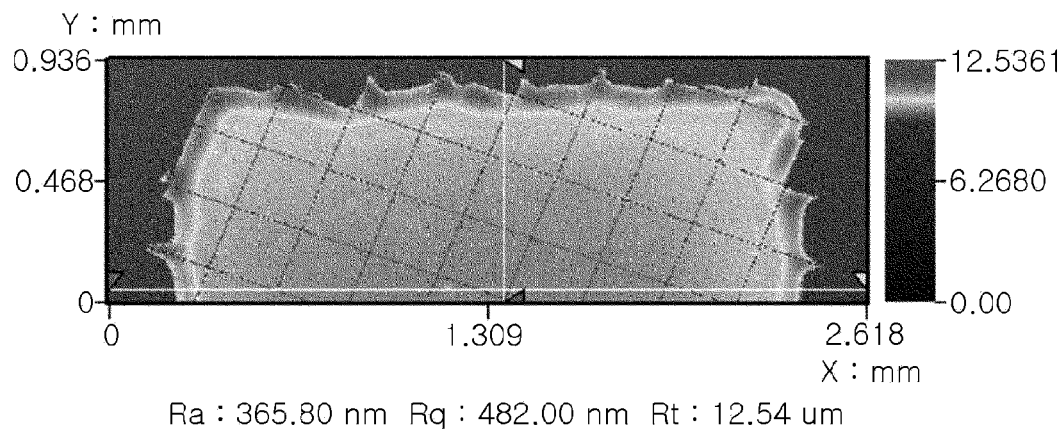
FIG. 6A is an image illustrating data obtained by measuring a horizontal cross section of an insulating layer formed using a method of forming an insulating layer according to Comparative Example 2.
Figure 6B:
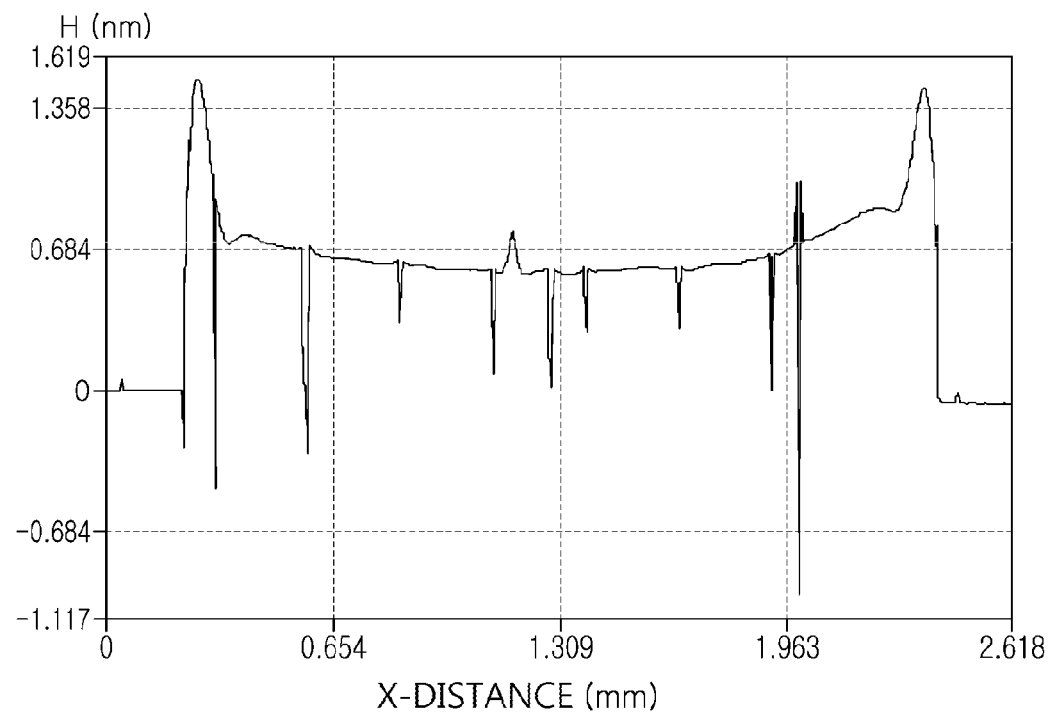
FIG. 6B is an image illustrating data obtained by measuring a vertical cross section of an insulating layer formed using the method of forming an insulating layer according to Comparative Example 2.
Figure 7A:
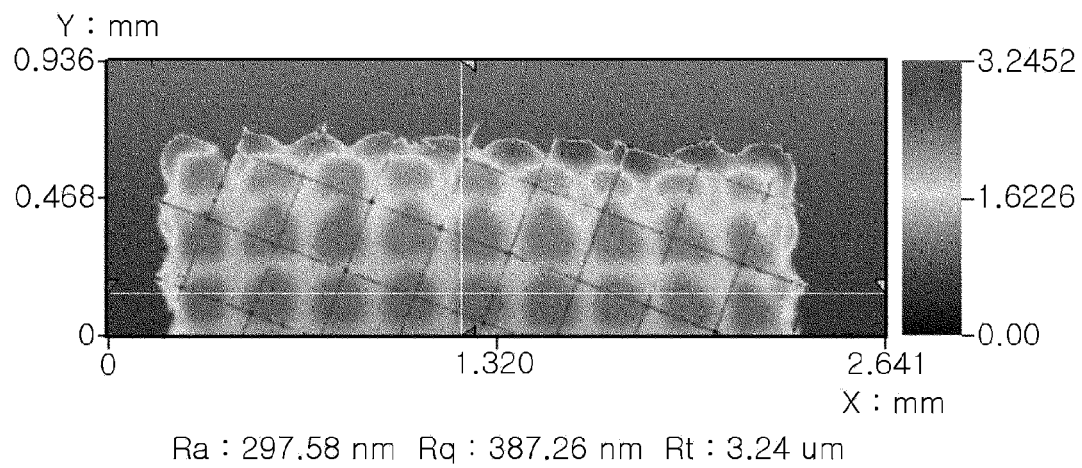
FIG. 7A is an image illustrating data obtained by measuring a horizontal cross section of an insulating layer formed using a method of forming an insulating layer according to Comparative Example 3.
Figure 7B:
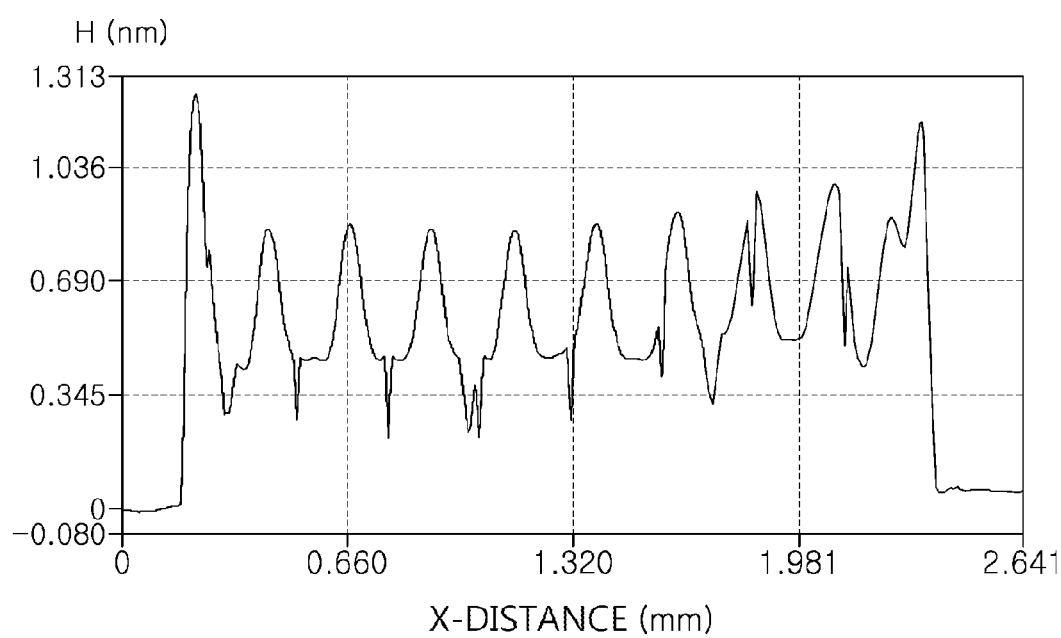
FIG. 7B is an image illustrating data obtained by measuring a vertical cross section of an insulating layer formed using the method of forming an insulating layer according to Comparative Example 3.

As compared to such a case, with reference to FIGS. 5A, 6A and 7A illustrating the horizontal cross sectional shapes of the insulating layers according to Comparative Examples 1 to 3, since edge portions of the insulating layers are shown as a red color and central portions thereof are shown as blue, it can be appreciated that the height of the edge portions thereof are higher than those of the central portions thereof. In addition, with reference to FIGS. 5B, 4B and 7B illustrating the vertical cross sectional shapes of the insulating layers according to Comparative Examples 1 to 3, it can be appreciated that concave shapes are exhibited.

For example, in the case of the insulating layer formed according to Embodiment 1 in which the insulating layer is formed using a method of forming an insulating layer according to an exemplary embodiment of the present disclosure, a coffee ring phenomenon may be prevented, the thickness of the insulating layer may be uniform, and the insulating composition may stably form a pattern.

However, in the case of the insulating layer according to Comparative Example 1 in which the patterning was performed once, a coffee ring phenomenon in which the thickness of the insulating layer is not uniform occurred. In addition, in the case of the insulating layer formed according to Comparative Example 2 in which the substrate heating temperature was higher than that in Embodiment 1, simultaneously with performing the patterning process once, dry was accelerated to rapidly increase a height of an edge portion of the pattern, thereby causing a more serious coffee ring phenomenon as compared to Comparative Example 1. Furthermore, in the case of the insulating layer formed according to Comparative Example 3, it could be appreciated that a higher degree of coffee ring phenomenon occurred in the entire section.

Measurement of Presence or Absence of Flow of Insulating Composition at the Time of Patterning Insulating layers were formed on metal mesh substrates at a room temperature using the insulating compositions prepared according to Embodiment 1 and Comparative Examples 1 to 3 through an inkjet head, and then, after 10 seconds, whether the insulating compositions flow was measured at the front of the substrate using a charge coupled device (CCD) camera (by Sony).

Figure 8:
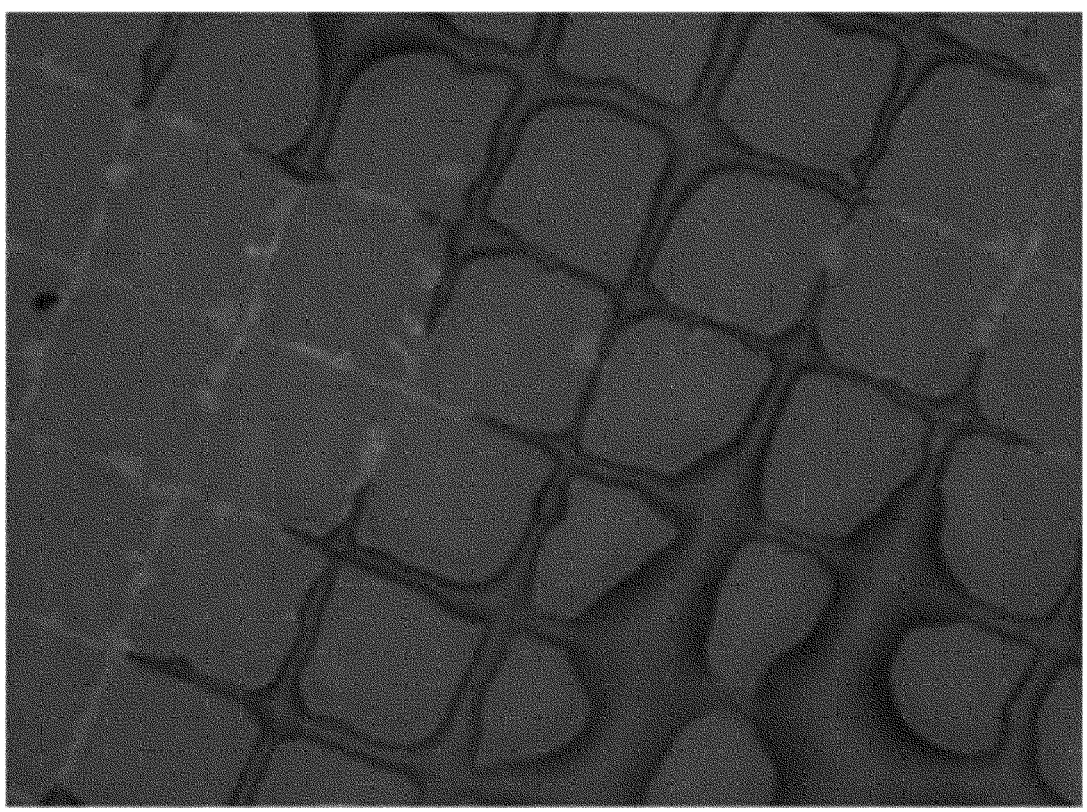
FIG. 8 illustrates a phenomenon in which when a temperature of a substrate is a room temperature, an insulating composition flows along a mesh of a substrate at the time of forming an insulating layer according to comparative example 1.

In the case of Embodiment 1 and Comparative Examples 2 and 3, a phenomenon in which the insulating composition flows from the copper mesh substrate was not observed. However, in the case of Comparative Example 1, the dry of ink was delayed as illustrated in FIG. 8 and the phenomenon in which the insulating composition flows from the copper mesh substrate was observed.

While exemplary embodiments have been shown and described above, it will be apparent to those skilled in the art that modifications and variations could be made without departing from the spirit and scope of the present disclosure as defined by the appended claims.

The invention claimed is:

1. A method of forming an insulating layer insulating a conductive pattern of a touchscreen from a bridge electrode of the touchscreen, the method comprising:
   heating a substrate provided with the conductive pattern formed on the substrate;
   sequentially forming a first pattern and a second pattern on the heated substrate using an insulating composition; and
   curing the first pattern and the second pattern,
   wherein the first pattern includes a groove portion to prevent adjacent patterns from overlapping each other and the second pattern is formed in the groove portion of the first pattern.

2. The method of claim 1, wherein the heating of the substrate is performed at a temperature of 40° C. to 80° C.

3. The method of claim 1, wherein a pitch of the first pattern ranges from 200 μm to 400 μm.

4. The method of claim 1, wherein a pitch of the second pattern is in a range of 0.5 to 1 times that of the first pattern.

5. The method of claim 1, wherein the forming of the first pattern and the second pattern is performed using a scheme of ejecting droplets of the insulating composition through inkjet printing.

6. The method of claim 5, wherein the first pattern and the second pattern formed using the ejected droplets have a dot shape or a linear shape.

7. The method of claim 6, wherein when the first pattern has the dot shape, a size of dots of the first pattern is in a range of 0.8 to 1 times the pitch of the first pattern.

8. The method of claim 7, wherein when the second pattern has the dot shape, a size of dots of the second pattern is in a range of 0.5 to 1 times the size of the dots of the first pattern.

9. The method of claim 6, wherein when the first pattern has the linear shape, a line width of the first pattern is in a range of 0.8 to 1 times the pitch of the first pattern.

10. The method of claim 9, wherein when the second pattern has the linear shape, a line width of the second pattern is in a range of 0.5 to 1 times the line width of the first pattern.

11. The method of claim 1, wherein the conductive pattern is formed using a metal mesh.

12. The method of claim 1, wherein the insulating composition comprises a novolac-type epoxy resin, a high boiling point solvent having a boiling point of 170° C. or higher, a low boiling point solvent having a boiling point ranging from 100° C. or higher to less than 170° C., and a curing agent.

13. The method of claim 12, wherein the insulating composition comprises:
   100 parts by weight of a novolac-type epoxy resin;
   80 to 570 parts by weight of a solvent; and 1 to 10 parts by weight of a curing agent,
wherein a weight ratio of the high boiling point solvent to the low boiling point solvent is within a range of 85 to 99:1 to 15.

14. The method of claim 12, wherein the novolac-type epoxy resin is a phenol novolac-type epoxy resin, a cresol novolac-type epoxy resin, or a bisphenol A (BPA)-novolac type epoxy resin.

15. The method of claim 12, wherein the curing agent is an imidazole-based curing agent.

16. An insulating layer formed using the method of forming an insulating layer of claim 1 has a convex shape in a vertical cross section.

17. The insulating layer of claim 16, wherein in the insulating layer, a difference in a thickness between a central portion of the vertical cross section and an edge portion of the vertical cross section is within a range of 50 nm to 150 nm.

18. The insulating layer of claim 16, wherein the thickness of the insulating layer is within a range of 100 nm to 2 μm.

19. A touchscreen including a substrate, a conductive pattern formed on the substrate, a bridge electrode formed on the conductive pattern, and an insulating layer interposed between the conductive pattern and the bridge electrode to insulate the conductive pattern from the bridge electrode, the touchscreen being characterized in that the insulating layer is formed using the method of forming an insulating layer of claim 1 and has a convex shape in a vertical cross section.

20. The touchscreen of claim 19, wherein in the vertical cross section of the insulating layer, a difference in a thickness between a central portion and an edge portion of the vertical cross section is within a range of 50 nm to 150 nm.

21. The insulating layer of claim 19, wherein the thickness of the insulating layer is in a range of 100 nm to 2 μm.

* * * * *